(12) United States Patent
Ogawa

(10) Patent No.: US 8,470,501 B2
(45) Date of Patent: Jun. 25, 2013

(54) MASK USED FOR FABRICATION OF MICROLENS, AND FABRICATION METHOD FOR MICROLENS USING THE MASK

(75) Inventor: Sachiko Ogawa, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 47 days.

(21) Appl. No.: 13/163,262

(22) Filed: Jun. 17, 2011

(65) Prior Publication Data

US 2011/0310492 A1    Dec. 22, 2011

(30) Foreign Application Priority Data

Jun. 17, 2010    (JP) .................................. 2010-138314

(51) Int. Cl.
    *G02B 3/00*    (2006.01)
(52) U.S. Cl.
    USPC ................ 430/5; 430/321; 430/330; 257/432
(58) Field of Classification Search
    None
    See application file for complete search history.

(56) References Cited

U.S. PATENT DOCUMENTS

| 5,835,274 | A | 11/1998 | Baek |
| 2004/0156112 | A1* | 8/2004 | Nakajima ...................... 359/619 |
| 2004/0263985 | A1* | 12/2004 | Boettiger ...................... 359/618 |
| 2010/0178614 | A1* | 7/2010 | Hwang et al. ................. 430/321 |

FOREIGN PATENT DOCUMENTS

| JP | 04-012568 | 1/1992 |
| JP | 10-074927 | 3/1998 |

* cited by examiner

*Primary Examiner* — John A. McPherson
(74) *Attorney, Agent, or Firm* — McDermott Will & Emery LLC

(57) ABSTRACT

A fabrication method is provided which makes it possible to obtain a microlens that is more tightly spaced (the space between individual microlenses is smaller) than in the related art, even when the same fabrication process as that in the related art is used. The present invention provides a mask used for fabrication of a microlens to irradiate a photosensitive microlens material on a substrate with a patterned light beam, including a main layout, and a sub-layout provided around the main layout, in which when the mask is irradiated with a light beam, a first beam pattern is obtained by the main layout at a position corresponding to a center portion of the microlens, and a second beam pattern separated (resolved) from the first beam pattern is obtained by the sub-layout around the first beam pattern.

6 Claims, 12 Drawing Sheets

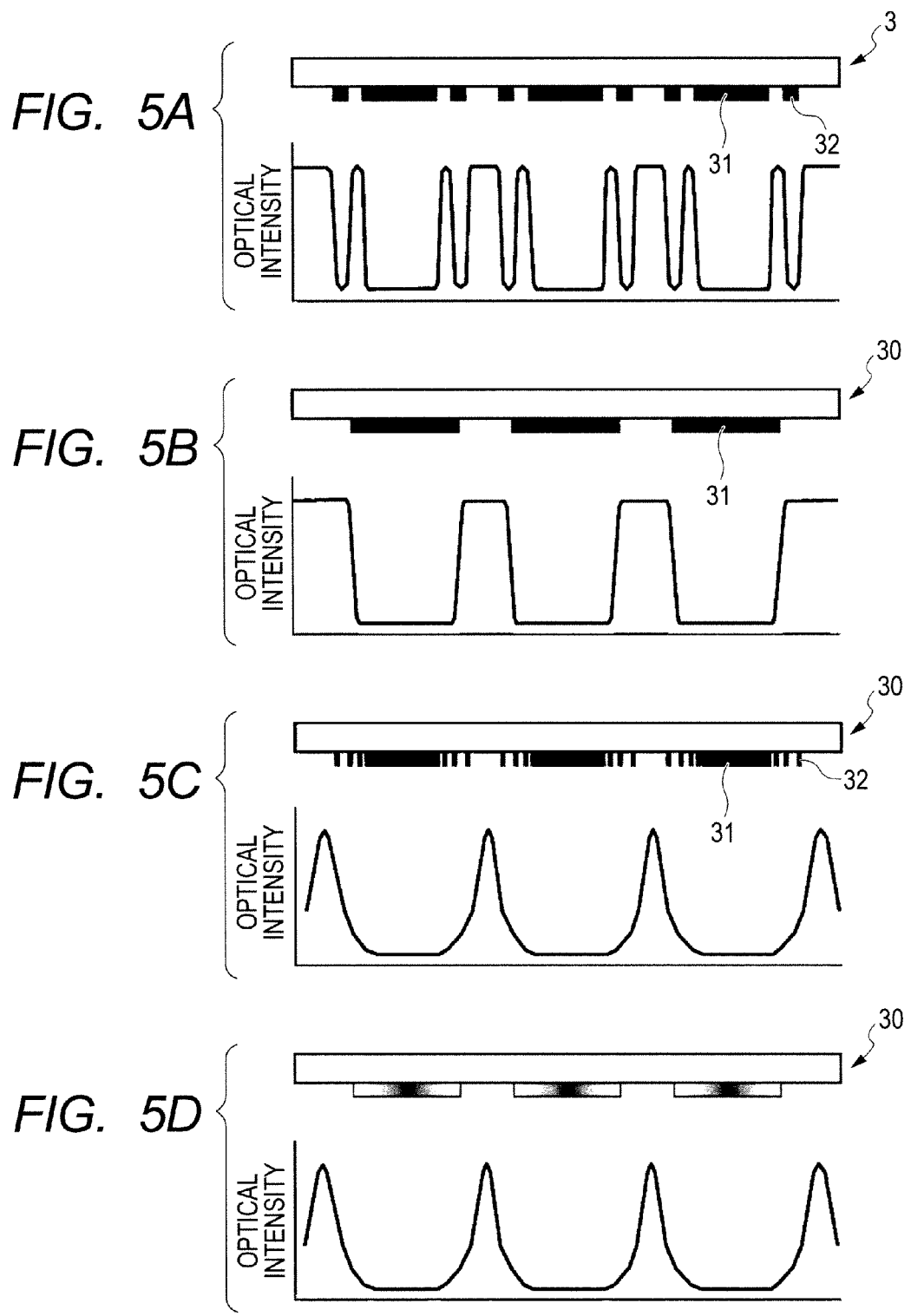

MASK USED FOR FABRICATION OF MICROLENS, AND FABRICATION METHOD FOR MICROLENS USING THE MASK

CROSS-REFERENCE TO RELATED APPLICATIONS

The disclosure of Japanese Patent Application No. 2010-138314 filed on Jun. 17, 2010 including the specification, drawings and abstract is incorporated herein by reference in its entirety.

BACKGROUND

The present invention relates to a mask used for fabrication of a microlens used as an imaging device or an image sensor, a fabrication method for a microlens using the mask, and an imaging device.

A fabrication method for a microlens according to the related art will be described with reference to FIGS. 11A to 11E and FIG. 12. A fabrication method for a microlens according to the related art is also disclosed in Japanese Unexamined Patent Publication No. Hei 4(1992)-12568.

First, a photosensitive microlens material 20 is coated onto a substrate 1 (FIG. 11A). Next, the microlens material 20 is irradiated with a light beam 41 (for example, I-rays) through a mask 30 used for obtaining a desired lens (FIG. 11B). The mask 30 used here has such a layout that a light-blocking region 31 (black portion) is arrayed as illustrated in FIG. 12. The microlens material 20 is irradiated with the light beam 41 through the light-blocking region 31.

Next, a photosensitive portion 21 is removed by developing the microlens material 20 with a developer, thereby forming a pattern 22 that serves as a base from which to fabricate a lens (FIG. 11C). The pattern 22 illustrated in FIG. 11C is a pattern to which the light-blocking region 31 of the mask 30 has been transferred.

Next, the entire surface of the substrate 1 on which the pattern 22 has been formed is irradiated with a light beam 42 (for example, a light beam including I-rays) (FIG. 11D). Through this treatment, the pattern 22 decreases in heat resistance due to reaction of the photosensitive groups in the pattern. Next, by applying heat treatment (baking) to the pattern 22, heat sag (a phenomenon in which a material softens, and changes into a shape as given by the balance between gravity and surface tension in accordance with the level of the softening) occurs, resulting in the shape of a microlens 24 (FIG. 11E). As the heat-sagged microlens 24 is cooled, a plurality of individual microlenses are fabricated on the substrate.

When used in an imaging device, for example, each microlens obtained in this way is required to allow external light to be efficiently captured on the photodiode in the imaging device. To that end, it is desired to minimize the space (narrow the spacing) between individual lenses on the substrate.

With the fabrication method according to the related art as described above, by taking into account the fact that the spacing between the individual patterns of microlens material obtained by irradiation with a patterned light beam through the mask (patterned exposure) becomes narrower due to heat sag, the spacing of each individual light-blocking region of the mask is set to the narrowest possible spacing that does not result in contact between individual microlenses, thereby obtaining a microlens with little redundant space. In the case where a microlens is fabricated by this method, the minimum spacing that allows individual microlenses to be resolved (separated) with good reproducibility depends on the precision with which the extent of spreading of the microlens material upon heat sag can be controlled.

However, with the method according to the related art, to control the extent of spreading of the microlens material upon heat sag with high precision, it is necessary to perform precise control of the temperature profile and temperature distribution during heat treatment, the uniformity of the composition of the microlens material, and so on. There is a limit to implementing such control in the actual production, and also the required process control is extremely complicated. Therefore, there is a limit as to how narrow the microlens spacing can be made by the method according to the related art. In actuality, although depending on the wavelength of the light beam used or the kind of the microlens material, when the spacing between the light-blocking regions of the mask becomes about 0.5 μm, a phenomenon occurs in which the spacing between the individual microlenses obtained becomes sharply narrow, causing bridging between the individual microlenses.

With the fabrication method according to the related art, to make the distance between individual microlenses narrow, it is necessary to make the material to spread widely due to heat sag at the substrate interface. Thus, the height of a microlens obtained due to heat sag becomes small. This results in the shape of a microlens having a very small contact angle with the underlying substrate as illustrated in FIG. 13A, or the shape of a microlens as illustrated in FIG. 13B, and it is difficult to obtain a microlens with an ideal shape as illustrated in FIG. 13C that provides a large contact angle and allows a sufficient height to be kept. It should be noted that as the shape of a microlens, it is desired to make the contact angle large to secure a sufficient height for the microlens itself, in other words, to make the radius of curvature small, because such a shape allows a wider range of light to be collected.

Japanese Unexamined Patent Publication No. Hei 10(1998)-74927 discloses a fabrication method for a microlens which can make the radius of curvature of a microlens larger, and make the radius of curvature the same between the transverse and longitudinal directions of the lens having a rectangular shape, by using a mask for microlens pattern. The mask for microlens pattern has a main light-blocking region, and an auxiliary light-blocking region formed in the vicinity of the main light-blocking region in such a way that its light transmittance increases with increasing distance from the main light-blocking region (see claim 1, and FIGS. 7, 9, and the like of Japanese Unexamined Patent Publication No. Hei 10(1998)-74927). However, the mask used in such a fabrication method has a problem in that fabrication of such a mask required high cost, because the resulting layout of the mask becomes extremely complicated, and also accurate designing becomes necessary. Moreover, the fabrication method disclosed in Japanese Unexamined Patent Publication No. Hei 10(1998)-74927 is not aimed at reducing the microlens spacing.

SUMMARY

The present invention provides a fabrication method that makes it possible to obtain a microlens that is more tightly spaced (the space between individual microlenses is smaller) than in the related art, even when the same fabrication process as that in the related art is used. The present invention also provides a fabrication method that makes it possible to obtain a microlens shaped so as to have an ideal contact angle.

The present invention relates to a mask used for fabrication of a microlens to irradiate a microlens material having photosensitivity on a substrate with a patterned light beam, including a main layout, and a sub-layout provided around the main layout, in which when the mask is irradiated with a light beam, a first beam pattern is obtained by the main layout at a position corresponding to a center portion of the microlens, and a second beam pattern separated (resolved) from the first beam pattern is obtained by the sub-layout around the first beam pattern.

Preferably, the main layout and the sub-layout are each formed by a light-blocking region, and the first beam pattern and the second beam pattern are each formed by a region that is not irradiated with the light beam (non-irradiated region).

Also, depending on the photosensitive characteristics of the microlens material used in microlens fabrication, the main layout and the sub-layout may each be formed by a light-transmitting region, and the first beam pattern and the second beam pattern may each be formed by a region that is irradiated with a light beam (irradiated region).

The present invention also relates to a fabrication method for a microlens, including the step of irradiating a microlens material having photosensitivity on a substrate with a patterned light beam by using the above-mentioned mask.

Preferably, the fabrication method according to an embodiment of the present invention further includes the following steps in the following order: coating a microlens material having photosensitivity onto a substrate; irradiating the microlens material with the patterned light beam; developing the microlens material; irradiating an entire surface of the microlens material with a light beam; and heating the microlens material.

Also, preferably, the fabrication method according to an embodiment of the present invention further includes the following steps in the following order: coating a microlens material onto a substrate; coating a photoresist material having photosensitivity onto the microlens material; irradiating the photoresist material with the patterned light beam; developing the photoresist material; irradiating an entire surface of the photoresist material with a light beam; heating the photoresist material; and transferring a shape of a photoresist obtained from the photoresist material to the microlens material by etching.

The present invention also relates to an imaging device including a microlens fabricated by the above-mentioned fabrication method for a microlens.

By using the mask according to an embodiment of the present invention to apply a patterned light beam in a microlens fabrication process, it is possible to obtain a microlens that is more tightly spaced (the space between individual microlenses is smaller) than in the related art, even when the same fabrication process as that in the related art is used. It is also possible to obtain a microlens of such a shape that keeps a sufficient height for the microlens and provides a large contact angle with the substrate.

BRIEF DESCRIPTION OF THE DRAWINGS

FIGS. 5A to 5D are schematic drawings, of which FIG. 5A illustrates the relationship between the shape of a mask according to an embodiment of the present invention and the intensity of a light beam transmitted through the mask, and FIGS. 5B to 5D each illustrate the relationship between the shape of a mask according to the related art and the intensity of a light beam transmitted through the mask;

FIG. 13C illustrates a desired shape of a microlens.

DETAILED DESCRIPTION

Embodiment 1

An embodiment of the present invention will be described with reference to FIGS. 1A to 1E and FIG. 2. FIGS. 1A to 1E are schematic cross-sectional views for explaining a process flow according to this embodiment. FIG. 2 is a schematic drawing illustrating an example of a mask used in Embodiment 1.

Figure 1A:
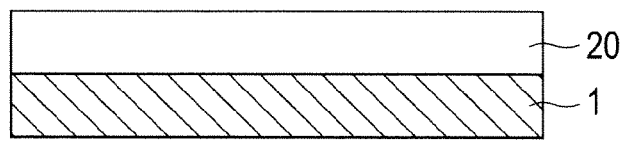
FIGS. 1A to 1E are a flow chart for explaining a fabrication method for a microlens according to Embodiment 1.
Figure 2:
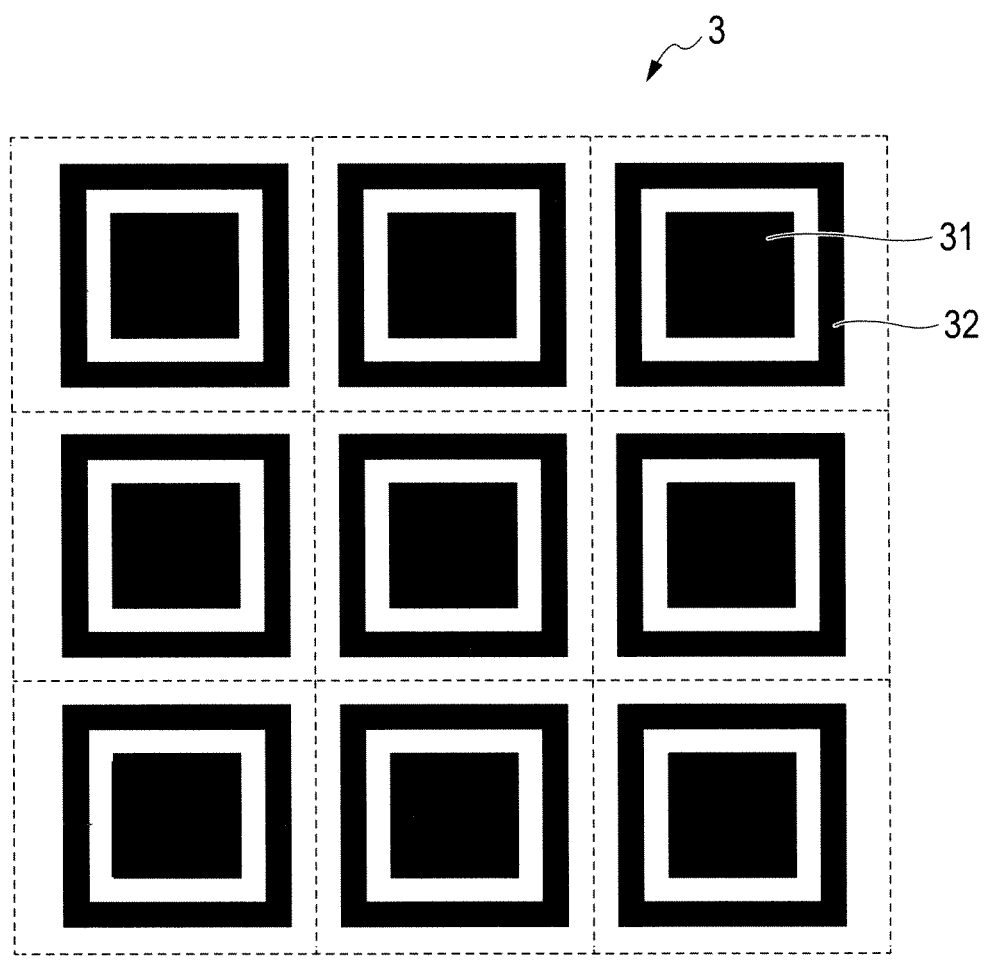
FIG. 2 is a schematic drawing illustrating an example of a mask used in Embodiment 1.

First, a photosensitive microlens material 20 is coated onto a substrate 1 (FIG. 1A). As the microlens material 20, various known materials used for microlens fabrication and having photosensitivity can be used, for example, a material including acrylic resin or phenolic resin, and a quinone-diazide group-containing photosensitive agent.

Figure 1B:
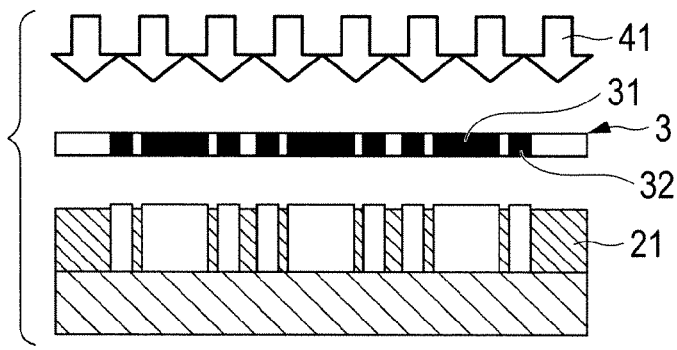

Next, the microlens material 20 is irradiated with a light beam 41 (for example, I-rays) through a mask 3 (FIG. 1B). As illustrated in FIG. 2, the mask 3 used here has a main layout formed by a light-blocking region (black portion) 31, and a sub-layout formed by a light-blocking region 32. The light beam 41 is applied to irradiate the microlens material 20 while being partially blocked (patterned) by the light-blocking regions 31 and 32.

Figure 1C:
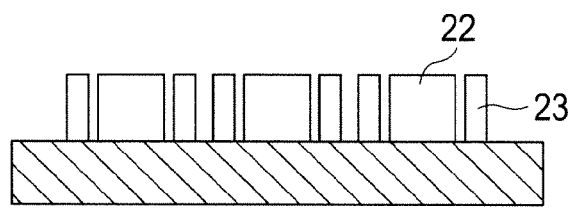

Next, a photosensitive portion 21 is removed by developing the microlens material 20 with a developer (for example, an aqueous solution of tetramethylammonium hydroxide), thereby forming patterns 22 and 23 that serve as a base from which to fabricate a lens (FIG. 1C). The patterns 22 and 23 illustrated in FIG. 1C are patterns to which the light-blocking regions 31 and 32 of the mask 3 have been transferred.

Figure 1D:
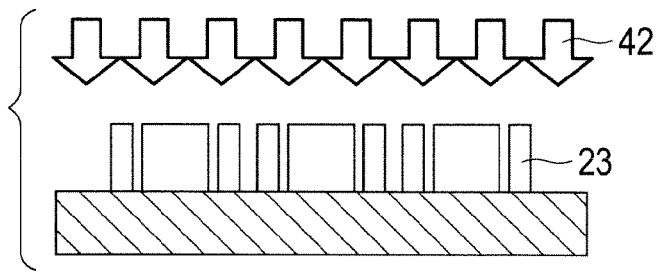
Figure 1E:
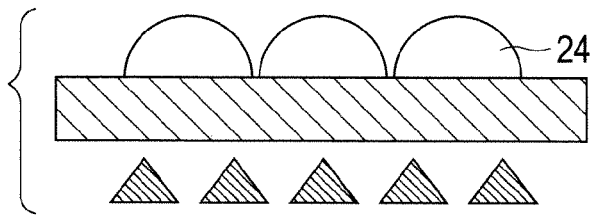

Next, the entire surface of the substrate 1 on which the patterns 22 and 23 have been formed is irradiated with a light beam 42 (for example, a light beam including I-rays) (FIG. 1D). Through this treatment, the patterns 22 and 23 decrease in heat resistance due to reaction of the photosensitive groups in the patterns. Next, heat treatment is applied to the patterns 22 and 23 to cause these patterns to undergo heat sag, thereby forming the shape of a microlens 24 (FIG. 1E).

At this time, since heat sag occurs earlier in the pattern 22 having a large volume, the extent of heat sag of the pattern 22 is restricted to a certain range by the pattern 23 that is less prone to heat sag. This allows precise control over the extent of heat sag, thereby making it possible to fabricate a microlens having a more tightly spaced layout than in the related art. One reason why heat sag proceeds more slowly in the pattern 23 having a small volume than in the pattern 22 is that in the case of a pattern having a small volume, the force (pushing force) acting on the flowing of the material at the substrate interface is small in comparison to a pattern having a large volume. Moreover, since it has been observed that something like a film is formed on the surface of the pattern 23 in the initial stage of heating, it is assumed that further protection is provided against flowing, but the details of this process have not been clarified yet.

By cooling the heat-sagged microlens 24 formed in this way, a plurality of individual microlenses are fabricated on the substrate.

The process flow according to an embodiment of the present invention is basically the same as that of the related art, except in that the layout of the mask used differs from that of the mask in the related art. The mask according to an embodiment of the present invention has a characteristic feature in that when the mask is irradiated with a light beam, a first beam pattern is obtained by the main layout at a position corresponding to the center portion of the microlens, and a second beam pattern separated (resolved) from the first beam pattern is obtained by the sub-layout around the first beam pattern.

The mask used in this embodiment described above has the main layout formed by the light-blocking region 31 that is rectangular, and the sub-layout formed by the light-blocking region 32 in the shape of a narrow line which is provided separately around the first light-blocking region 31. By irradiating the microlens material with a light beam in a patterned fashion (having a first non-irradiated region corresponding to the light-blocking region 31, and a second non-irradiated region corresponding to the light-blocking region 32) by using such a mask, the patterns 22 and 23 comprised of the microlens material are separated (resolved) from each other.

This will be described more specifically with reference to FIGS. 5A to 5D. FIGS. 5A to 5D each illustrate the distribution of optical intensity (vertical axis) corresponding to the shape of the mask 3, 30 in the case when patterned exposure is carried out using the mask according to an embodiment of the present invention (FIG. 5A), a mask commonly used in the related art (FIG. 5B), and the mask according to the related art used in Japanese Unexamined Patent Publication No. Hei 10(1998)-74927 (FIGS. 5C and 5D).

As illustrated in FIG. 5A, the optical intensity due to the mask 3 according to an embodiment of the present invention is such that there is a large contrast in optical intensity between the portion corresponding to each of the main layout (light-blocking region 31) and the sub-layout (light-blocking region 32), and the other portion. For this reason, the patterns of microlens material formed on the substrate after exposure and development using such a mask (the patterns 22 and 23 illustrated in FIGS. 1A to 1E) are separated with respect to each individual microlens (pixel)) (every two patterns 22 and 23 correspond to a single microlens).

To separate the individual patterns in this way, it is necessary to provide a predetermined amount of spacing or more between the main layout (light-blocking region 31) and the sub-layout (light-blocking region 32). For the individual patterns 22 and 23 to be separated, for example, the spacing between the light-blocking region 31 (main layout) and the light-blocking region 32 (sub-layout) is preferably equal to or more than 0.7 times, more preferably equal to or more than 1.0 times, of the wavelength of the light beam 41. However, if the spacing is too large, the pattern formed by the main layout is merged with the heat sag of the sub-layout in the state where the contact angle of the heat-sagged pattern with the substrate is small, or in the state where it is not possible to secure a sufficient lens height. Thus, the resulting lens does not have a round, bowl-like shape.

In the mask according to an embodiment of the present invention, the optimum spacing between the main layout (the light-blocking region 31) and the sub-layout (the light-blocking region 32) is determined in accordance with the wavelength of the light beam used, the microlens material (the photoresist material described later) used, and so on. For example, in the case of using I-rays (wavelength), a preferred spacing is 0.3 μm to 0.5 μm.

On the other hand, FIG. 5B illustrates the distribution of optical intensity in the case where a mask commonly used in the related art is used. The patterns of microlens material formed on the substrate after exposure and development using this mask are such that one pattern is formed for each single microlens (pixel).

FIGS. 5C and 5D each illustrate the distribution of optical intensity in the case where the mask according to the related art used in Japanese Unexamined Patent Publication No. Hei 10(1998)-74927 is used. The mask 30 illustrated in FIG. 5C is a mask having a light-blocking region 31, and a light-blocking region 32 formed in the vicinity of the light-blocking region 31 in such a way that its light transmittance increases with increasing distance from the light-blocking region 31. The mask 30 illustrated in FIG. 5D is a halftone mask that exhibits the same effect (optical intensity distribution) as the mask illustrated in FIG. 5C. As shown in FIGS. 5C and 5D, while the optical intensity distribution in the case where each of these masks is used differs from that in FIG. 5B, as in the case of FIG. 5B in which a mask commonly used in the related art is used, the patterns of microlens material formed on the substrate after exposure and development using such a mask are such that one pattern is formed for each single microlens (pixel).

In the case where separated patterns of microlens material (the patterns 22 and 23 illustrated in FIGS. 1A to 1E) are formed by irradiating the microlens material with a light beam that is patterned using the mask according to an embodiment of the present invention, and then developing the resulting microlens material, when heat sag occurs, the individual patterns independently undergo the heat sag phenomenon without affecting each other. As a characteristic feature of the heat sag phenomenon, at temperatures not sufficiently above the softening point of the material, the amount of heat sag in a fixed time varies with the difference in volume or width between individual patterns. The amount of heat sag is larger for patterns with larger volumes and larger widths.

Therefore, in this embodiment, it is preferable that the area of the light-blocking region 31 of the mask 3 illustrated in FIG. 2 be larger than the area of the light-blocking region 32. In other words, in the mask used in the present invention, the first beam pattern (for example, the first non-irradiated region) obtained by the main layout upon irradiation with light beams is preferably larger than the area of the second beam pattern (for example, the second non-irradiated region) obtained by the sub-layout. Alternatively, the width of the first beam pattern is preferably larger than the width of the second beam pattern.

When patterned exposure is performed using such a mask, the area of the pattern 22 becomes larger than the area of the pattern 23, and the pattern 22 on the inner side that undergoes a large amount of heat sag immediately sticks to the pattern 23 on the outer side. At this time, the pattern 23 on the outer side that undergoes a small amount of heat sag plays the role of a dike that restricts the extent of heat sag of the pattern 22 to cause the spacing between individual microlenses to narrow gradually, thereby improving the dimensional precision of the microlens. Also, the edge portion of the obtained microlens can be made to retain such a shape that its contact angle with the substrate does not become small.

Since softening of a mixture containing resin and a solvent contributes to the above-mentioned effects, these effects depend more on physical properties than on the chemical properties of the material, and hence the amount of heat sag can be controlled by the material composition and the heat treatment conditions. Accordingly, it is possible to use not only the above-described photosensitive microlens material including acrylic resin and a photosensitive agent made of a quinone-diazide group-containing photosensitive agent, but also a photosensitive microlens material using a combination of phenolic resin or the like and a photosensitive agent.

Examples of the light beam applied to irradiate the microlens material according to an embodiment of the present invention include I-rays, KrF-rays, and G-rays, of which I-rays are preferred. According to the present invention, the resolution of the microlens (the minimum microlens spacing) prior to heat sag obtained in the case where I-rays are used is approximately 0.35 µm, which can be made to 0.2 µm or less by optimization of the conditions applied. Also, the resolution of the microlens obtained in the case where KrF-rays are used is approximately 0.2 µm, which can be made to 0.12 µm or less by optimization of the conditions applied.

Other Forms of Masks

Figure 3:
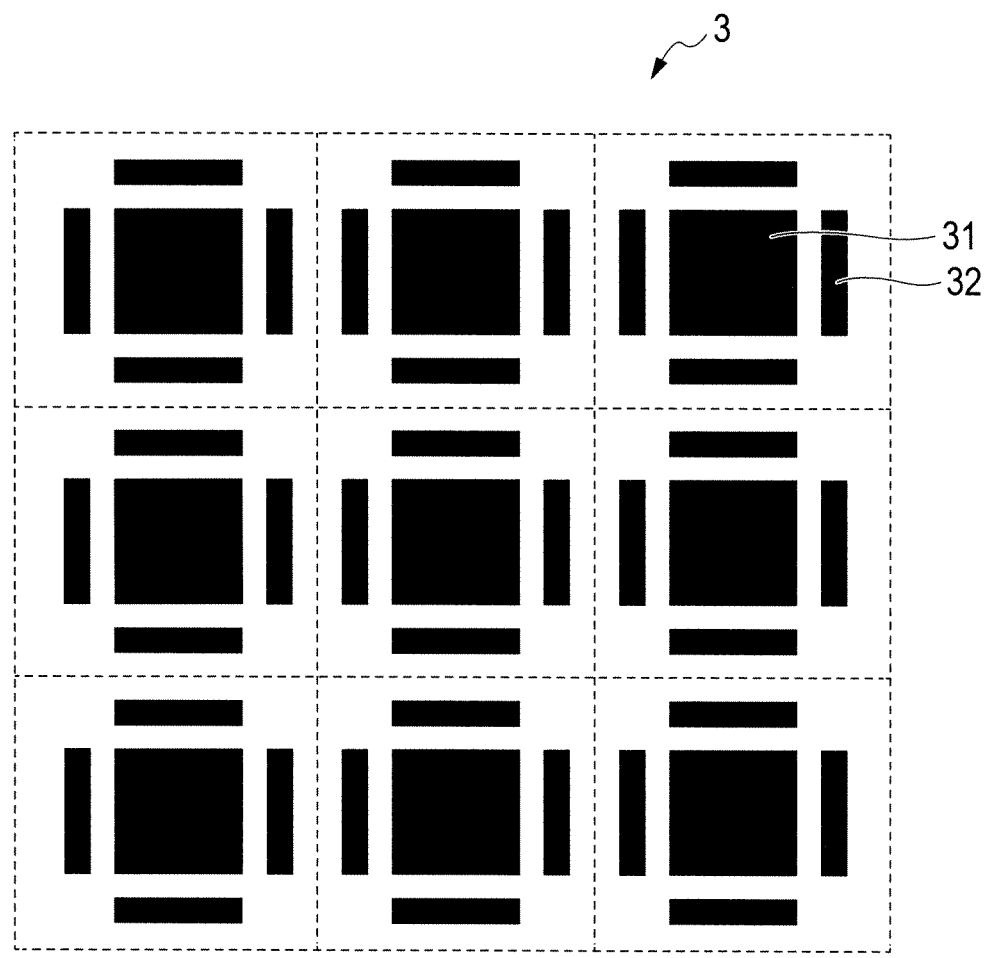
FIG. 3 is a schematic drawing illustrating another example of the mask used in Embodiment 1.
Figure 4:
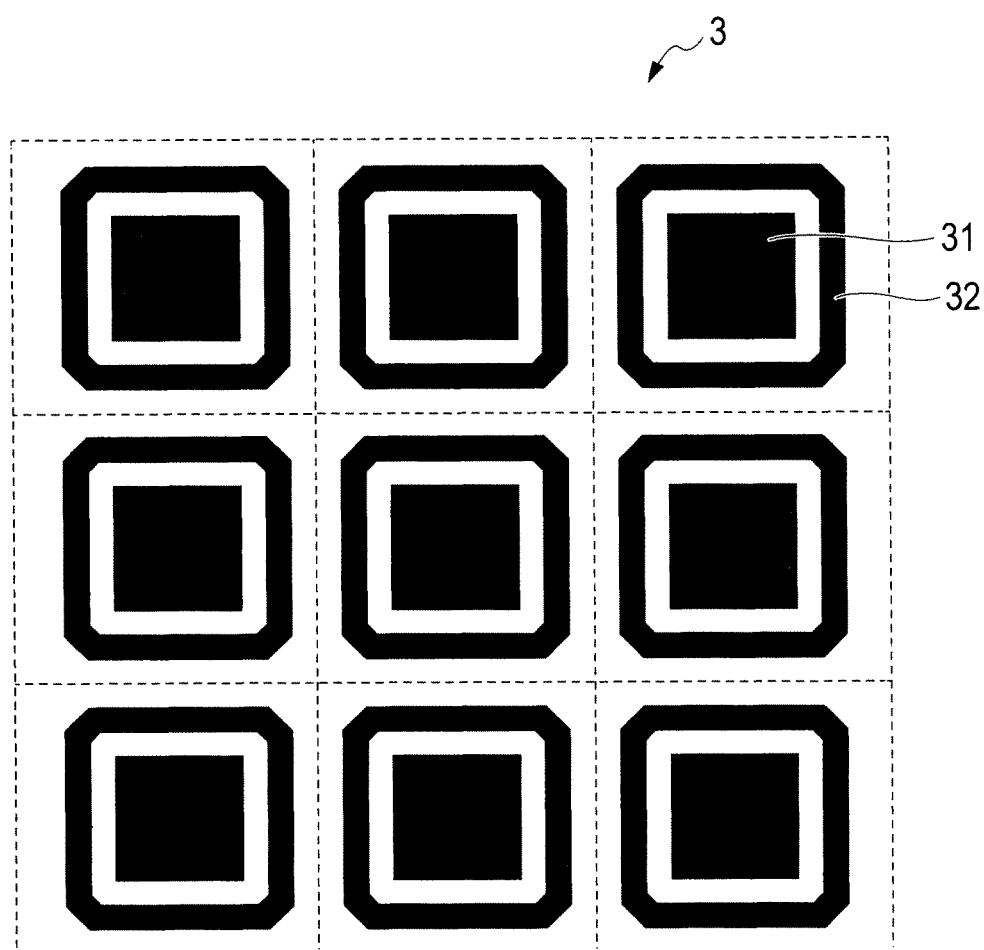
FIG. 4 is a schematic drawing illustrating still another example of the mask used in Embodiment 1.

Other than the mask illustrated in FIG. 2, masks having the layouts as illustrated in FIGS. 3 and 4 can be also used as the mask used in this embodiment.

The mask illustrated in FIG. 3 has a layout in which a bar-like light-blocking region 32 is arranged around a rectangular light-blocking region 31. It is advantageous to use a mask having such a layout in the case where, for example, it is desired for the convenience of microlens layout to provide a large space in the portion where gaps between individual microlenses cross each other.

The mask illustrated in FIG. 4 differs from the mask illustrated in FIG. 2 in that the corners of the light-blocking region 32 are chamfered. Using a mask having such a layout is also advantageous in controlling the layout of the microlens finally obtained.

To adapt to various layouts required for a microlens, the mask according to an embodiment of the present invention may have a layout in which various patterns of different sizes/shapes are arranged on the mask. The mask having such a layout may be applied to controlling not only a microlens but also various other pattern shapes.

Further, other than the above-mentioned mask, the scope of the present invention also covers a mask having a plurality of sub-layouts arranged in multiple loops around the main layout such that another sub-layout is further arranged around a sub-layout. It should be noted, however, that in this case as well, the first beam pattern (for example, the first non-irradiated region) obtained by the main layout at a position corresponding to the center portion of the microlens, and the second beam pattern (for example, the second non-irradiated region) obtained by at least the sub-layout arranged on the outermost side need to be separated (resolved) from each other.

Embodiment 2

While Embodiment 1 is directed to the case in which patterning is directly applied to the photosensitive microlens material, in this embodiment, after a photoresist having the same shape as that of a desired microlens is formed on top of a coating of microlens material, a microlens is fabricated by etching the photoresist using a mask.

Specifically, after forming a coating of microlens material on a substrate, a coating of photosensitive photoresist material is further formed on top of this coating. Then, from the coating of photoresist material, a photoresist having the same shape as that of a desired microlens is prepared by a process flow using a mask similar to that in Embodiment 1. By using this photoresist to etch the microlens material underneath the photoresist, the same pattern shape as the photoresist can be transferred to the microlens material.

This embodiment will be described in more detail with reference to FIGS. 6A to 6F. FIGS. 6A to 6F are schematic cross-sectional views for explaining a process flow according to this embodiment.

Figure 6A:
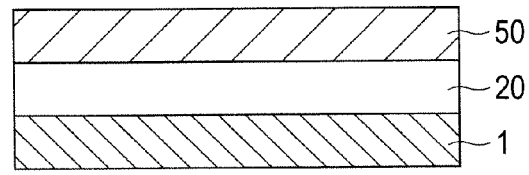
FIGS. 6A to 6F are a flow chart for explaining a fabrication method for a microlens according to Embodiment 2.

First, a non-photosensitive microlens material 20 is coated onto a substrate 1, and a photoresist material 50 is further coated on top of the resulting coating (FIG. 6A). While the same material as that used in Embodiment 1 may be also used as the microlens material 20, in that case, it is necessary to perform decolorization by making light incident on the photosensitive groups in the microlens material.

Figure 6B:
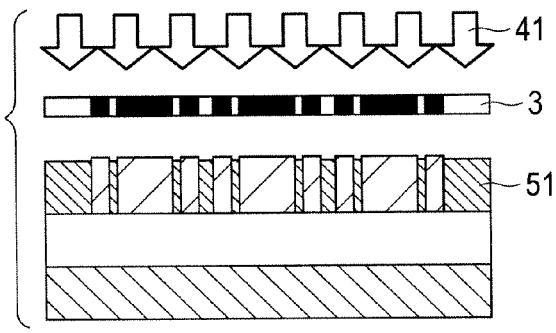

Next, the photoresist material 50 is irradiated with a light beam (for example, I-rays) 41 through a mask 3 (FIG. 6B). The mask 3 used here is a mask having a main layout formed by a light-blocking region 31 and a sub-layout formed by a light-blocking region 32 as in Embodiment 1. The light beam 41 is applied to irradiate the microlens material 20 while being partially blocked (patterned) by the light-blocking regions 31 and 32.

Figure 6C:
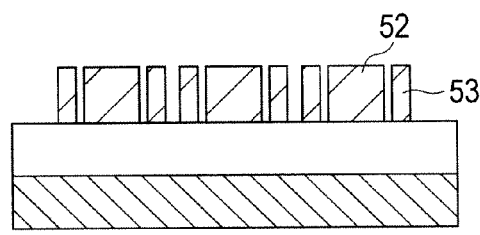

Next, a photosensitive portion 51 is removed by developing the photoresist material 50 with a developer, thereby forming patterns 52 and 53 that serve as a base from which to fabricate a photoresist (FIG. 6C). The patterns 52 and 53 illustrated in FIG. 6C are patterns to which the light-blocking regions of the mask 3 have been transferred.

Figure 6D:
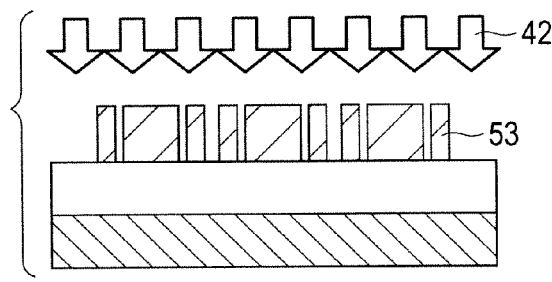
Figure 6E:
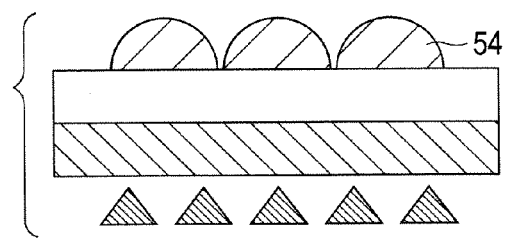
Figure 6F:
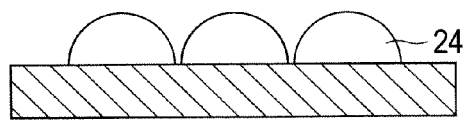

Next, the entire surface of the substrate 1 on which the patterns 52 and 53 have been formed is irradiated with a light beam 42 (for example, a light beam including I-rays) (FIG. 6D). Through this treatment, the patterns 52 and 53 decrease in heat resistance due to reaction of the photosensitive groups in the patterns. Next, heat treatment is applied to the patterns 52 and 53 to cause these patterns to undergo heat sag, thereby forming a photoresist 54 having the same shape as that of a desired microlens (FIG. 6E).

At this time, since heat sag occurs earlier in the pattern 52 having a large volume, the extent of heat sag of the pattern 52 is restricted to a certain range by the pattern 53 that is less prone to heat sag. This allows precise control over the extent of heat sag, thereby making it possible to fabricate a photoresist of the same shape as a microlens having a more tightly spaced layout than in the related art. One reason why heat sag proceeds more slowly in the pattern 53 having a small volume than in the pattern 52 is that in the case of a pattern having a small volume, the force (pushing force) acting on the flowing of the material at the substrate interface is small in comparison to a pattern having a large volume. Moreover, since it has been observed that something like a film is formed on the surface of the pattern 53 in the initial stage of heating, it is assumed that further protection is provided against flowing, but the details of this process have not been clarified yet.

By cooling the heat-sagged photoresist 54 formed in this way, the photoresist 54 having the same shape as that of a desired microlens is fabricated on top of the microlens material 20.

By transferring the shape of the photoresist 54 to the microlens material 20 by various known etching techniques by using the photoresist 54 mentioned above, a microlens 24 having the same shape as that of the photoresist 54 is fabricated. Therefore, in this embodiment as well, as in Embodiment 1, it is possible to fabricate a microlens having a more tightly spaced layout than in the related art.

Embodiment 3

A description will be given below of an embodiment of an imaging device including a microlens obtained by the fabrication method according to each of Embodiments 1 and 2 of the present invention mentioned above, with reference to FIG. 7.

Figure 7:
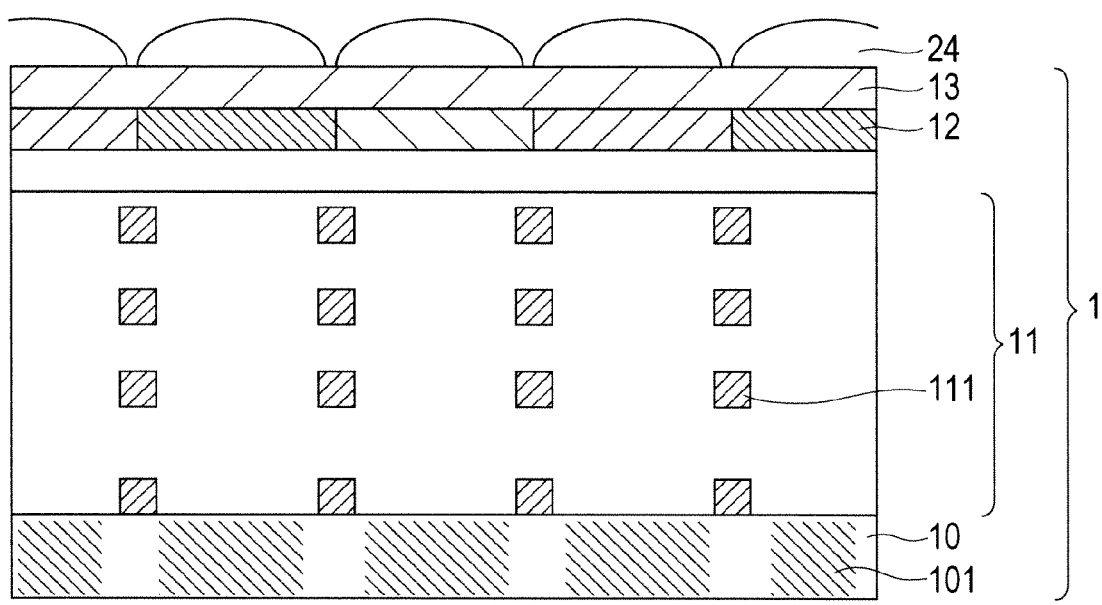
FIG. 7 is a schematic cross-sectional view of an imaging device including a microlens obtained by a fabrication method according to an embodiment of the present invention.

The imaging device illustrated in FIG. 7 includes a substrate 1 that has a wiring layer 11 having wires 111, a color filter 12, and a flattening layer 13 provided in this order on top of a photodiode substrate 10 having a photodiode 101. By using the fabrication method according to an embodiment of the present invention, a microlens having a desired layout according to the layout of the photodiode 101, the wires 11, and the color filter 12 can be formed on top (on the flattening layer 13 side) of the substrate 1.

EXAMPLES

Example 1

Figure 8A:
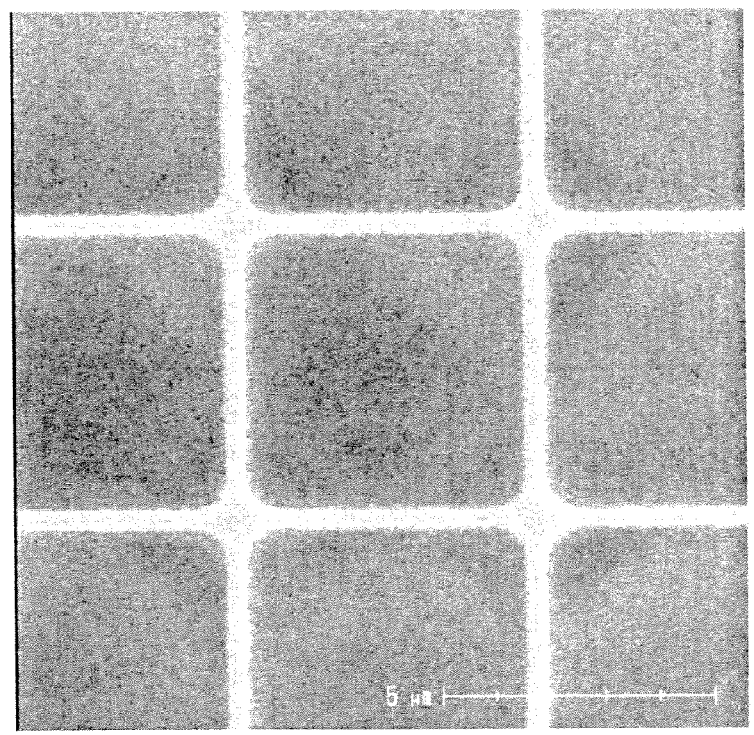
FIGS. 8A and 8B are a drawing illustrating the photograph of a microlens obtained in Example 1, and a schematic drawing illustrating the layout of a mask used in Example 1, respectively.
Figure 8B:
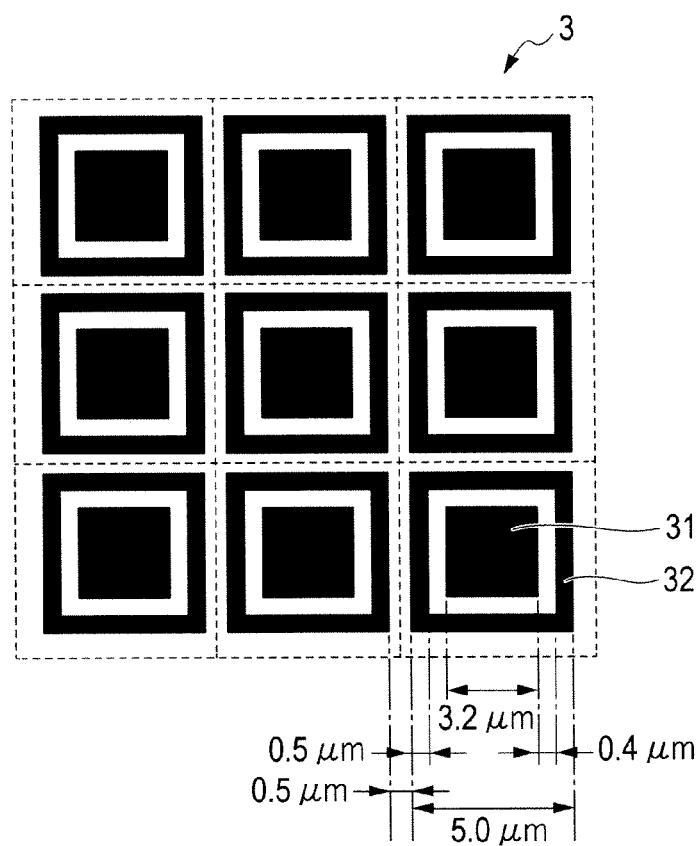

In this example, a microlens was fabricated in accordance with the fabrication method according to Embodiment 1, by using a mask illustrated in FIGS. 8A and 8B similar to that in FIG. 2.

As a microlens material, a photosensitive microlens material including acrylic resin and a quinone-diazide group-containing photosensitive agent was used. The microlens material was coated onto a substrate at a thickness of 2 µm.

The mask used as the mask illustrated in FIG. 8B is such that the width of the line-shaped light-blocking region 32 on the outer side is 0.5 µm, one side of the outer frame is 5.0 µm, one side of the rectangular (square) light-blocking region 31 on the inner side is 3.2 µm, and the spacing between the light-blocking region 31 and the light-blocking region 32 is 0.4 µm (see FIG. 8B). The spacing between adjacent light-blocking regions 32 is 0.5 µm. In this case, even when subjected to the same heat treatment, the pattern 23 (corresponding to the line-shaped light-blocking region 32) on the outer side of the obtained microlens material undergoes a small amount of heat sag, and the pattern 22 (corresponding to the rectangular light-blocking region 31) on the inner side undergoes a large amount of heat sag.

I-rays were used as the light beam applied to irradiate the microlens material. After forming the patterns of microlens material, the entire surface of the resulting microlens material was irradiated with a light beam (I-rays), followed by heat treatment (baking) at 150° C. to 200° C. using a hot plate for eight minutes.

FIG. 8A illustrates a photograph taken by observing a microlens in the state illustrated in FIG. 1E formed in this way, with a scanning electron microscope from above the substrate. The microlens spacing at this time was 0.1 µm.

Comparative Example 1

Figure 12:
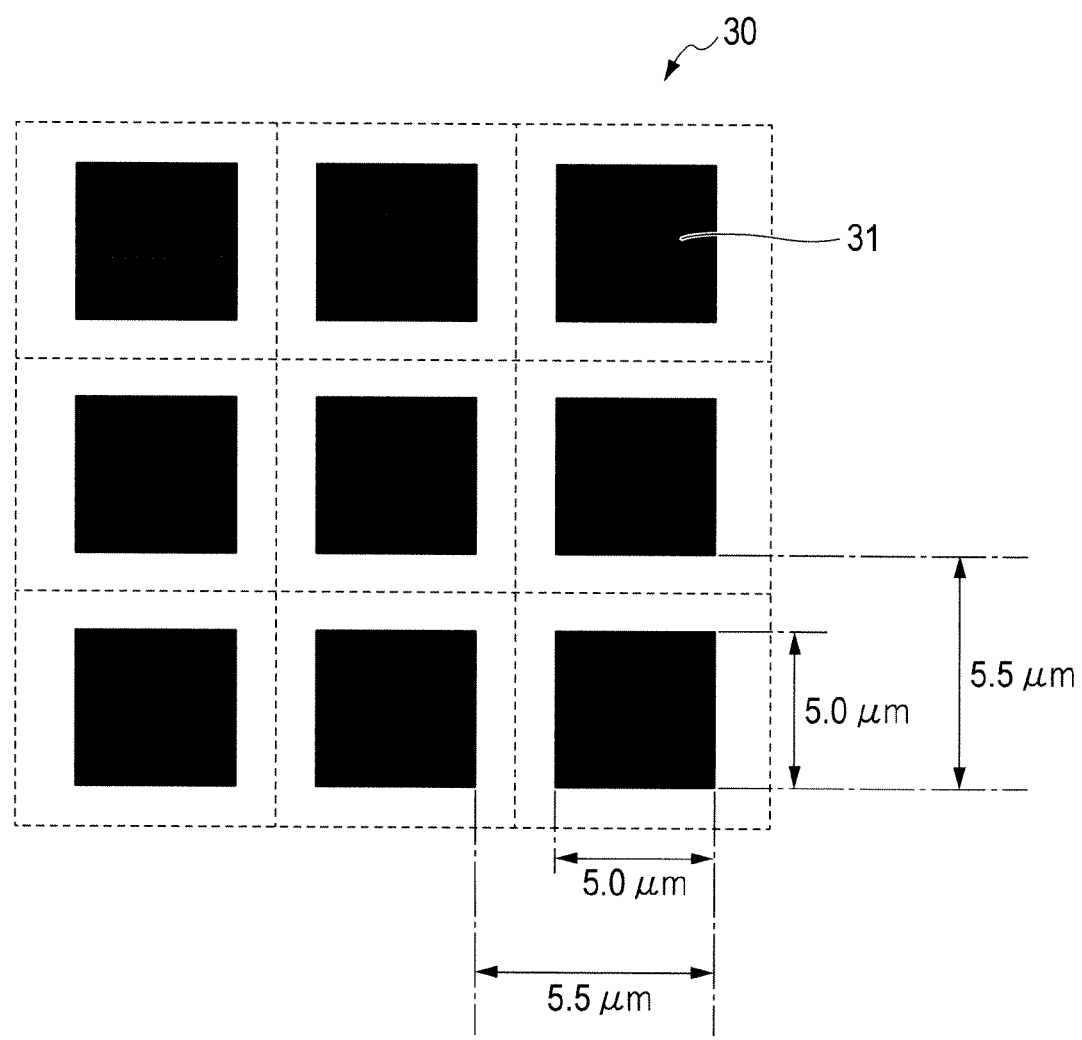
FIG. 12 is a schematic drawing illustrating an example of a mask according to the related art.
Figure 13A:
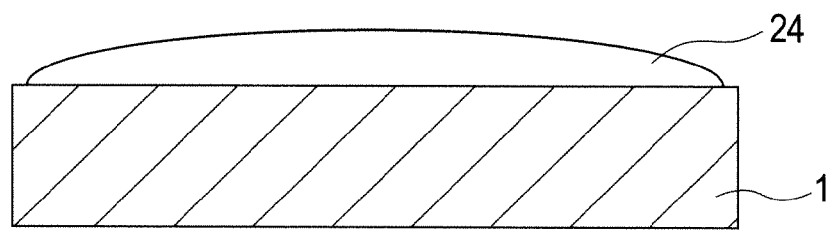
FIGS. 13A to 13C are schematic drawings, of which FIGS. 13A and 13B each illustrate the shape of a microlens according to the related art.
Figure 13B:
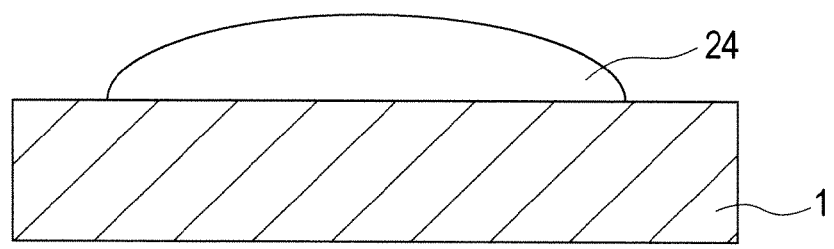
Figure 13C:
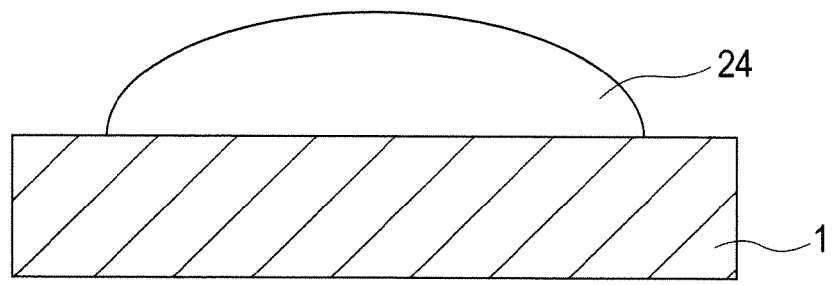

In Comparative Example 1, a microlens was fabricated in the same method as in Embodiment 1, except in that the mask according to the related art illustrated in FIG. 12 was used. It should be noted that the mask used is a mask in which the shape of the light-blocking region 31 (black pattern) illustrated in FIG. 12 is a square with a size of 5.0 µm×5.0 µm, and the pitch of the light-blocking region 31 is 5.5 µm (the spacing between the individual light-blocking regions 31 is 0.5 µm).

Figure 9:
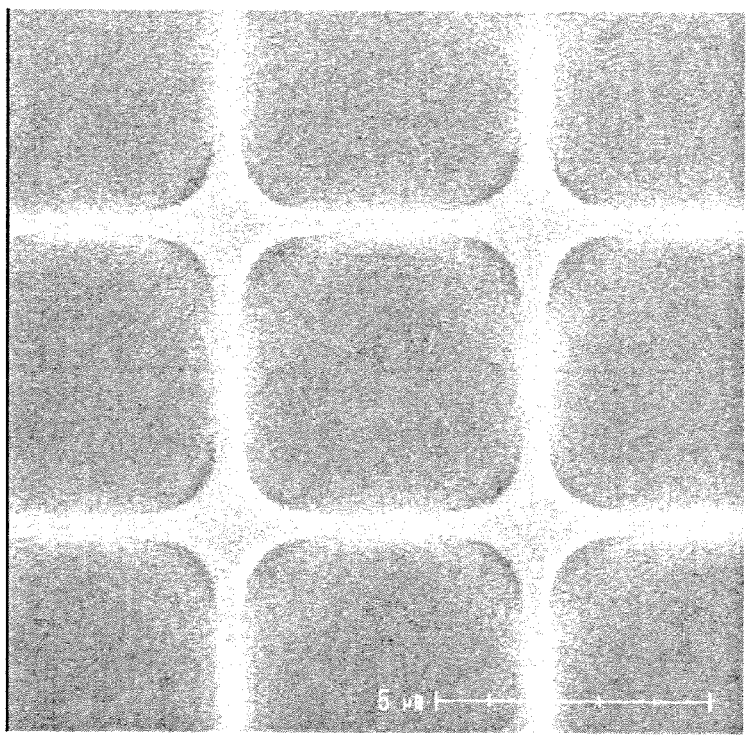
FIG. 9 is a drawing illustrating a photograph of an example of a microlens obtained in Comparative Example 1.
Figure 11A:
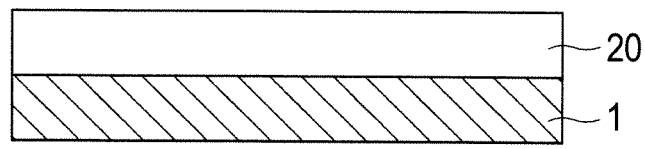
FIGS. 11A to 11E are a flow chart for explaining a fabrication method for a microlens according to the related art.
Figure 11B:
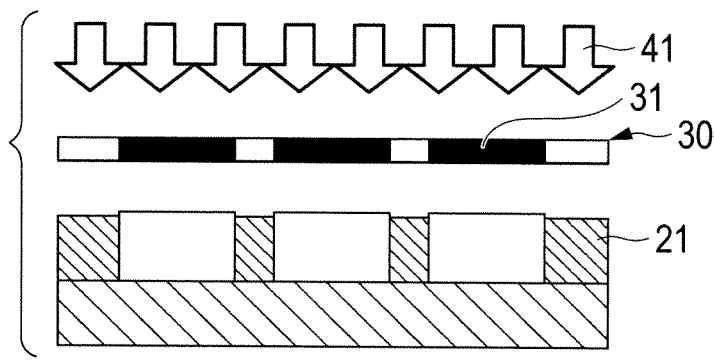
Figure 11C:
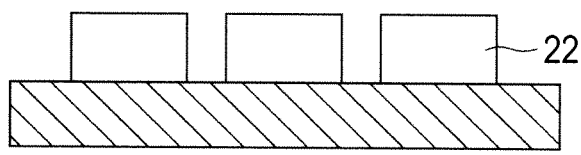
Figure 11D:
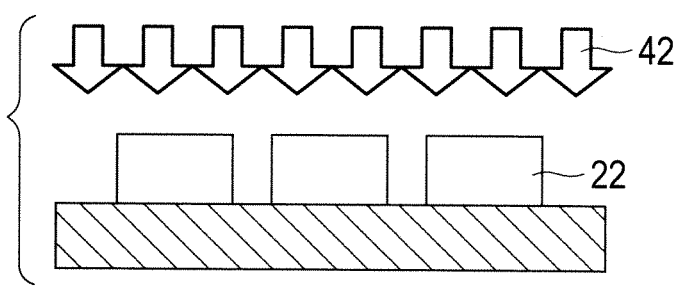
Figure 11E:
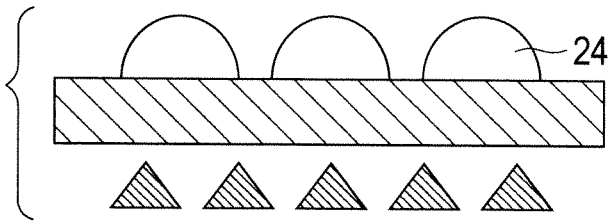

FIG. 9 illustrates a photograph taken by observing a microlens in the state illustrated in FIG. 11E, with the scanning electron microscope from above the substrate. As illustrated in FIG. 9, the microlens spacing was 0.2 µm. Also, the spacing was wider in the portions where the spaces between the microlenses cross each other.

Likewise, a microlens was fabricated using a mask in which the shape of the light-blocking region 31 illustrated in FIG. 12 is a square with a size of 5.0 µm×5.0 µm, while varying the spacing between the individual light-blocking regions 31 as 0.4, 0.5, 0.6, 0.7, 0.8, 0.9, and 1.0 µm (while varying the pitch of the light-blocking region 31 as 5.4, 5.5, 5.6, 5.7, 5.8, 5.9, and 6.0 µm). The spacing between individual microlenses obtained was measured.

Figure 10:
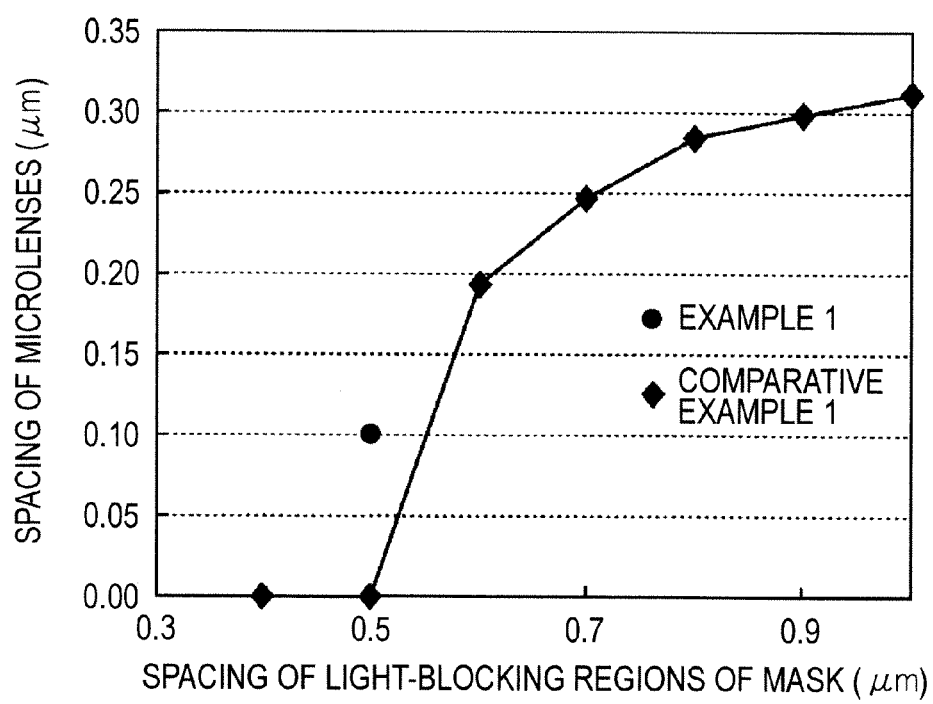
FIG. 10 is a graph illustrating the relationship between the spacing of light-blocking regions of a mask and the spacing of microlenses in each of Example 1 and Comparative Example 1.

FIG. 10 illustrates the relationship between the spacing of light-blocking regions of each of the masks used in Example 1 and Comparative Example 1, and the spacing of the obtained microlenses. As illustrated in FIG. 10, at the time when the spacing of the light-blocking regions of the mask changes from 0.6 µm to 0.5 µm, the spacing of the obtained microlenses becomes sharply narrower, leading to a phenomenon in which bridging occurs between the microlenses. For this reason, it is difficult to make the microlens spacing smaller than 0.2 µm. In contrast, in Example 1, it can be appreciated that even when the spacing of the light-blocking regions of the mask is set to 0.5 µm, it is possible to set the microlens spacing to 0.1 µm, without causing bridging between the microlenses.

What is claimed is:

1. A mask used for fabrication of a microlens to irradiate a microlens material having photosensitivity over a substrate with a patterned light beam, comprising:
    a main layout; and
    a sub-layout provided around the main layout,
    wherein the main layout has no opening, and the sub-layout surrounds the main layout in the form of a single ring,
    wherein when the mask is irradiated with a light beam, a first beam pattern is obtained by the main layout at a position corresponding to a center portion of the microlens, and a second beam pattern separated from the first beam pattern is obtained by the sub-layout around the first beam pattern.

2. The mask according to claim 1,
    wherein the main layout and the sub-layout each include a light-blocking region, and
    the first beam pattern and the second beam pattern are each formed by a region that is not irradiated with the light beam.

3. A fabrication method for a microlens, comprising the step of irradiating a microlens material having photosensitivity over a substrate with a patterned light beam by using the mask according to claim 1.

4. The fabrication method for a microlens according to claim 3, comprising the following steps in the following order:
    coating a microlens material having photosensitivity onto a substrate;
    irradiating the microlens material with the patterned light beam;
    developing the microlens material;

irradiating an entire surface of the microlens material with a light beam; and heating the microlens material.

5. A fabrication method for a microlens comprising the following steps in the following order:

coating a microlens material onto a substrate;

coating a photoresist material having photosensitivity on top of the microlens material;

irradiating the photoresist material with a patterned light beam by using the mask according to claim 1;

developing the photoresist material;

irradiating an entire surface of the photoresist material with a light beam;

heating the photoresist material; and transferring a shape of a photoresist obtained from the photoresist material to the microlens material by etching.

6. An imaging device comprising a microlens fabricated by the fabrication method for a microlens according to claim 3 or 5.

* * * * *